United States Patent [19]
Heilbronner

[11] Patent Number: 5,856,913
[45] Date of Patent: Jan. 5, 1999

[54] MULTILAYER SEMICONDUCTOR DEVICE HAVING HIGH PACKING DENSITY

[75] Inventor: Heinrich Heilbronner, Stein, Germany

[73] Assignee: Semikron Elektronik GmbH, Germany

[21] Appl. No.: 839,928

[22] Filed: Apr. 21, 1997

[30] Foreign Application Priority Data

Apr. 29, 1996 [DE] Germany .................. 196 17 055.9

[51] Int. Cl.[6] ................................................. H05K 1/16
[52] U.S. Cl. .................... 361/760; 361/762; 361/764; 361/772; 361/749; 361/777; 361/750; 361/751; 361/807; 257/778; 257/781; 257/782; 257/783; 257/736; 257/750; 257/753; 257/762; 174/255; 174/250; 174/256; 174/260
[58] Field of Search .................... 361/760, 762, 361/764, 765, 772, 749, 777, 750, 751, 807, 809, 820; 257/736, 750, 753, 762, 778, 779, 781, 782, 783, 786, 723, 686, 724; 174/255, 250, 256, 260

[56] References Cited

U.S. PATENT DOCUMENTS

| | | | |
|---|---|---|---|
| 4,800,461 | 1/1989 | Dixon et al. | 361/751 |
| 5,313,367 | 5/1994 | Ishiyama | 361/772 |
| 5,633,480 | 5/1997 | Sato et al. | 174/255 |
| 5,646,446 | 7/1997 | Nicewarner, Jr. et al. | 257/723 |

*Primary Examiner*—Lynn D. Feild
*Assistant Examiner*—David Foster
*Attorney, Agent, or Firm*—Morrison Law Firm

[57] ABSTRACT

A semiconductor power module has semiconductor components mounted on a substrate. The semiconductor components are in electrical contact with the substrate. Internal circuit wiring is achieved by using one or more flexible circuit boards. The flexible circuit board(s) contact the semiconductor components and also provide external connection elements. Hermetical encapsulation is achieved by lamination, and height equalization of the different circuit regions is achieved by using geometrically preformed prepregs in conjunction with the flexible circuit board and the substrate.

10 Claims, 1 Drawing Sheet

MULTILAYER SEMICONDUCTOR DEVICE HAVING HIGH PACKING DENSITY

BACKGROUND OF THE INVENTION

The present invention relates to a semiconductor power module for use in power electronics. More particularly, the present invention relates to a semiconductor power module having a multilayer or sandwich design.

The reliability, lifetime and density of semiconductor power modules can be increased if new material combinations are employed, or if new methods are applied with which the individual components can be combined into a single unit for integration into various types of circuits. An increased density of power semiconductor components requires a design which adequately isolates the power semiconductor elements and which exhibits excellent heat conductivity for dissipating heat that is generated at the p-n junctions.

In the case of an isolating design of power semiconductor modules having copper-coated insulating and heat-conducting substrates, the active components are affixed through soldering. Such positive connections ensure excellent heat dissipation and well-adjusted positioning of the individual elements within the arrangement.

Until now, in commutation circuits with circuit arrangements for conversion and driving technology, the establishment of switched connections of semiconductor elements on the surface of a circuit has conventionally been accomplished by means of bonding methods, since the relatively fine structure of the chip contact surfaces does not allow any other contacting methods. For example, connections between chip contact points and the secondary joining elements on DCB ceramics often use aluminum wires of up to 330 µm in thickness. The aluminum wires are bonded in multiple parallel fashion through positive subject jointing, such as, for example, by a method employing ultrasound. During bonding, ultrasound and the pressure of a bond chisel produce a structural change in the aluminum wire, which is detrimental to stability in long-term operation. The aluminum wire eventually develops structural cracks at the bonding points, which lead to the breaking of the connection between the chip contact surface and the aluminum wire. Consequently, it is not yet possible to achieve the desired maximal long-term stability with this technology.

As is disclosed in DE 36 37 513 A1, a two-layer metal coating can be used to reduce the large number of connections in the front of the power components (such as MOS-FETs (Metal Oxide-Silicon Field Effect Transistors) or IGBTs (Isolated Gate Bipolar junction Transistors)), which are repeated and must be isolated from each other, to a smaller number that can be soldered or pressure-contacted. However, it is generally still considered state of the art in power electronics to achieve the required isolation stability between live parts by means of additional protection, such as silicon rubber in the form of an isolating cast or soft cast.

On the other hand, DE 31 19 239 A1 discloses a multilayer structure of large-scale integration (LSI) semiconductor components. In this case, due to very low voltages and voltage differences between the individual internal interconnections, it is not necessary to isolate the individual contact lines or electrical connections from each other.

Another method is disclosed in DE 44 07 810 A1. In power structures of that type, the necessary isolating cast serves simultaneously as a pressure element. Therefore, even though its size is reduced in comparison with devices made according to prior art, the design of this circuit arrangement still has a certain minimal height. In DE 41 32 947 A1, positive substance jointing (soldering) is replaced by positive substance pressure contacting (adhesive or glue paste fixation), whereby individual components are contacted on one or both sides by flexible circuit boards. However, this approach does not satisfactorily address the problem of achieving the required flash-over resistance when the voltage differences inside the circuit are high.

OBJECTS AND SUMMARY OF THE INVENTION

Accordingly, it is an object of the present invention to overcome the limitations of the prior art, as described above.

It is another object of the present invention to provide a semiconductor power module which utilizes the principle of sandwich construction to increase the module's useful lifetime.

It is another object of the present invention to provide a semiconductor power module having a high packing density.

It is another object of the present invention to provide a semiconductor power module having good isolation of semiconductor components while maintaining a minimal overall height.

It is another object of the present invention to provide a semiconductor power module having high flash-over resistance in the presence of large voltage differences inside a circuit.

Briefly stated, a semiconductor power module has semiconductor components mounted on a substrate. The semiconductor components are in electrical contact with the substrate. Internal circuit wiring is achieved by using one or more flexible circuit boards. The flexible circuit board(s) contact the semiconductor components and also provide external connection elements. Hermetical encapsulation is achieved by lamination, and height equalization of the different circuit regions is achieved by using geometrically preformed prepregs in conjunction with the flexible circuit board and the substrate.

According to one embodiment of the invention, a semiconductor power module comprises an electrically isolating substrate, a layer of electrically conducting material on each of two opposing surfaces of the substrate, a semiconductor component, having a first face and a second face, the semiconductor component requiring cooling during operation, the first face of the semiconductor component being in electrical contact and thermal contact with one of the layers of electrically conducting material, the second face of the semiconductor component being in electrical contact with a flexible circuit board, and a structured intermediate isolation layer, having recesses for the semiconductor component and for at least one contact point.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENT

Figure 1:
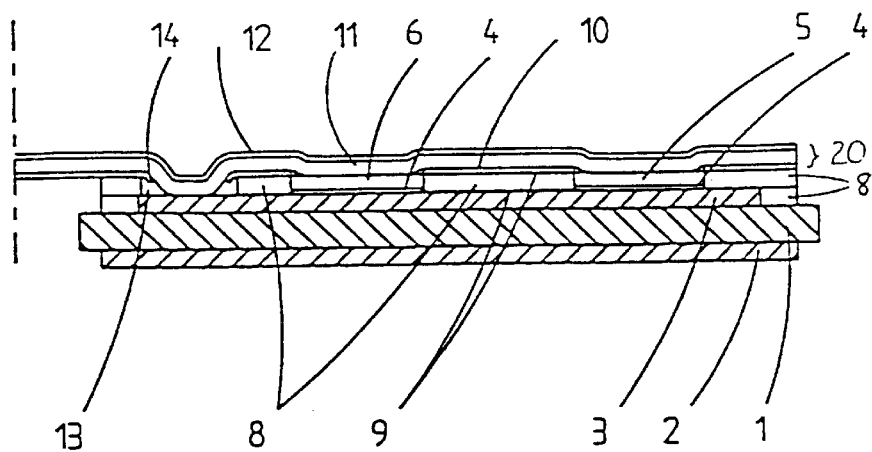
FIG. 1 shows a cross-sectional view of a semiconductor power element according to the present invention.
Figure 2:
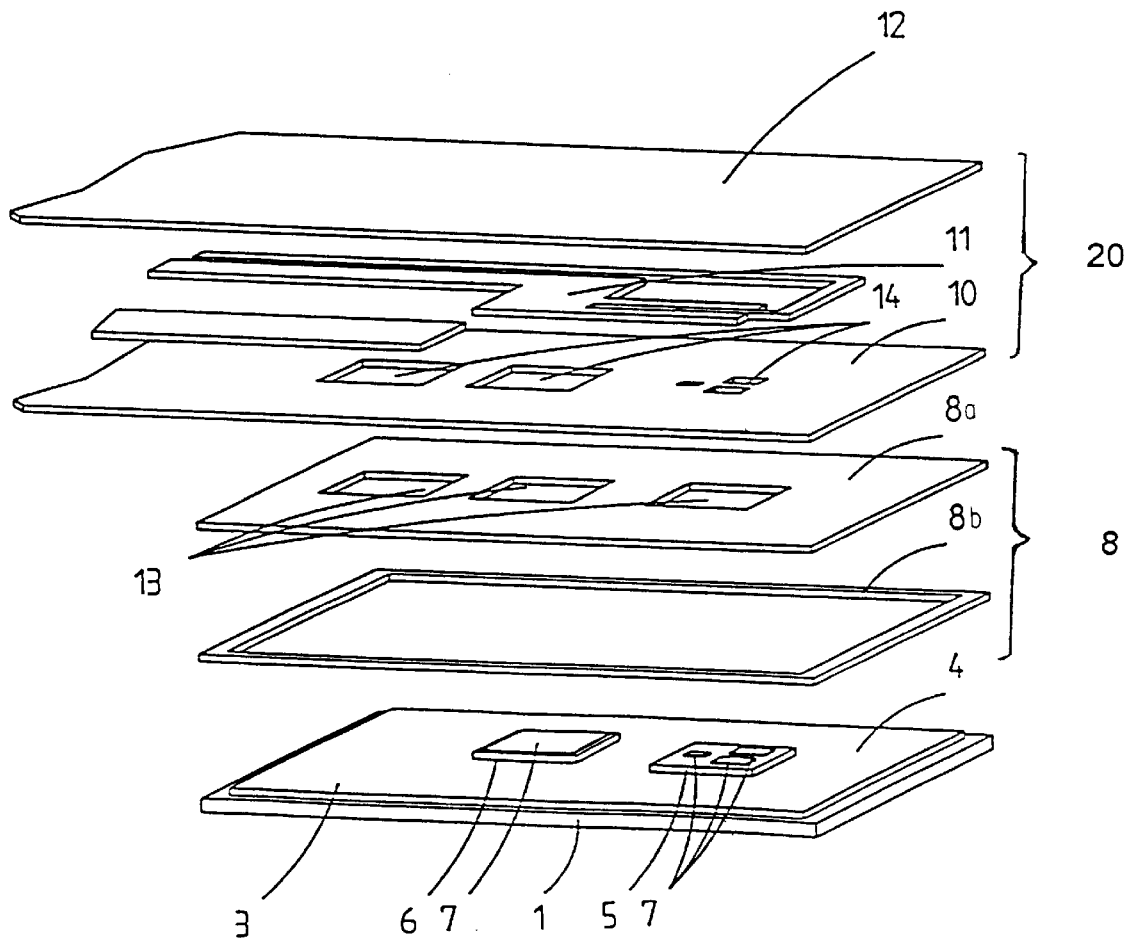
FIG. 2 shows an expanded planar view of the layer structure according to the present invention.

Referring now to FIGS. 1 and 2, a cross-sectional cut-out of a semiconductor power module according to the present invention has semiconductor components 5 and 6, such as a transistor or a free-running diode. The structure of the power module consists of a substrate 1, coated on opposing surfaces with copper films 2 and 3. Substrate 1 is, for example, a DCB ceramic, consisting of an aluminum oxide layer. On copper film 3, soldering with a soft solder 4, which is well-known in the art, is used to produce an ohmic contact with at least one semiconductor element, such as a transistor or a free-running diode. In reference to FIG. 1, two semiconductor elements 5 and 6 are shown. When positioning additional semiconductor components, the shape of copper film 3 is altered as required. In a previous technical processing step, contact surfaces of semiconductor components 5 and 6 are provided with a solderable contact layer 7.

The further design provides for the installation of at least one so-called prepreg 8, such as is described, for example, in the catalogues issued by the firm of Krempel, P.O. Box 484, Stuttgart and by Insula of D-52348 Düren. Prepreg 8 can be formed, for example, from a glass fabric/epoxy resin laminate by coating the laminate on both sides with a bonding agent and an epoxy resin 9, where epoxy resin 9 has been pre-treated in a curing state according to the prior art. Referring now to FIG. 2, prepeg 8 is shown as being comprised of prepeg 8a and prepeg 8b. Appropriate holes 13 are punched into prepreg 8a to provide contact points on copper layer 3 of substrate for semiconductor components 5 and 6. The edges of holes 13 are coated in any appropriate manner, such as with silicon rubber. The edges of substrate 1 are sealed by prepeg 8b. The thickness of prepregs 8a and 8b are calculated so that the upper surface of prepegs 8a and 8b are coplanar with the plane of the upper surfaces of semiconductor components 5 and 6 in the soldered condition.

A previously prepared flexible circuit board 20 is laminated onto the thus produced level surface, forged of semiconductor components 5 and 6 and prepregs 8a and 8b. The lamination can be performed simultaneously with the soldering process for contacting semiconductor components 5 and 6. Flexible circuit board 20 consists of polyimide films 10 and 12, for which a film thickness of 25 $\mu$m is sufficient to achieve the necessary penetration resistance rates. Films 10 and 12 enclose switched copper conducting strips 11 and isolate them against each other. Lower polyimide film 10, facing semiconductor components 5 and 6, contains openings 14 in circuit board 20 through which copper conducting strips 11, which are provided with a solderable surface, have been electrically contacted by soldering according to the circuit structure. The electrical connection between copper film 3 of substrate 1 and switched copper conducting strips 11 of flexible circuit board 20 is accomplished in a very simple manner by simultaneous soldering, which is made possible by the flexibility of circuit board 20.

Copper conducting strips 11 of flexible circuit board 20 are a significant element of the present invention. When the power requirements of a circuit arrangement are high, copper conducting strips 11 may have a thickness of up to 0.4 mm. The circuit design according to the present invention makes it possible to make copper conducting strips 11 wide in cross-section, so that large cross-sections are available for power transport. Consequently, copper conducting strips 11 generate less heat under the work load of the electric current, and copper conducting strips 11 can participate in heat dissipation from semiconductor components 5 and 6 in the same manner as copper films 2 and 3 of substrate 1.

FIG. 2 shows in three-dimensional view the layered construction described in relation to FIG. 1. Substrate 1, which is coated on both sides with flat copper, is provided on upper copper film 3 with semiconductor components 5 and 6 required for the circuit arrangement. As already explained, these are soldered into position or, if the design calls for pressure contact, fixed by means of electrically conductive intermediate layers such as a paste or adhesive. Prepreg 8, which is adapted in size, is provided with holes 13 required for accommodating semiconductor components 5 and 6 and for direct contact between copper layer 2 and conductor strips 11 of flexible circuit board 20.

Lower film 10, which is designed for the layout of flexible circuit board 20, has corresponding openings 14 for electrical contact with contact layers 7 of the semiconductor components 5 and 6. Copper conducting strips 11, intended for the electrical connections, are surface-treated in the positions where they contact semiconductor components 5 and 6 through openings 14 in lower film 10 and holes 13 in prepeg 8a. Cover film 12 provides good mechanical and excellent electrical protection for the secondary circuit layers.

Flexible circuit board 20 can be provided in the same manner with multi-layered copper laminates, each electrically isolated against each other by means of polyimide films, which can be connected to each other in switched mode through metal-coated passages. According to the invention, very high packing densities can thus be achieved by means of mirror-symmetrically arranged equal or complementary circuit layers. When water cooling systems are used, heat dissipation from the semiconductor components is unproblematic, which means that circuit layers of great impact resistance can be made, especially for mobile applications.

The design according to FIGS. 1 and 2 is similarly possible, as in the prior art, for employing the principles of pure pressure contact. In this embodiment, an appropriately formed bridge element, a pressure pad and a pressure plate must be provided on the surface of flexible circuit board 20. However, some features of this embodiment are worth noting. First, prior to laminating prepreg 8a and 8b onto copper film 3, the semiconductor components 5 and 6 must be fixed in an electrically conductive manner so that no epoxy resin 9 can permeate and interrupt the electrical contact between the rear of each component 5 and 6 and copper film 3. Permeation is retarded by previous cross-linking and structuring of epoxy resin surface layer 9 of prepregs 8a and 8b, and by the above named edge coating of holes 13. Second, contact surfaces 7 of semiconductor components 5 and 6 must have a surface quality adapted for pressure contacts, since the very complex MOSFET and IGST structures are extremely sensitive to uneven power loads. A desirable surface coating can be achieved by applying a fairly thick layer of silver coating, e.g. >10 $\mu$m, which is also advantageous for soldering joints.

Flexible circuit board 20 according to the present invention is very well suited for pressure contact conditions where point overloads must be avoided. For this it is desirable to use fairly thick polyimide films, e.g. 50 $\mu$m or 100 $\mu$m, which at that thickness act as pressure equalization buffers.

Circuit arrangements according to the present invention do not require soft casting, such as with organosilicon compounds, as is common in the prior art. Hermetical encapsulation is achieved by lamination with prepreg 8. Mutual electrical isolation is achieved by coating the edges of holes 13 of prepreg 8a and by polyimide films 10 and 12. This accounts for the advantage of the present invention of very good heat transition on both sides of semiconductor components 5 and 6, regardless of whether the design calls for pressure contact or soldering. Also worth noting are the advantages that considerably less space is required due to the low-profile design of circuit arrangements according to the present invention, and that circuit layouts can be more flexible as the result of flexible circuit board 20.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A semiconductor power module, comprising:
   an electrically isolating substrate;
   a layer of electrically conducting material on each of two opposing surfaces of said substrate;
   at least one semiconductor component, having a first face and a second face;
   said first face of said semiconductor component being in electrical contact and thermal contact with one of said layers of electrically conducting material;
   said second face of said semiconductor component being in electrical contact with a flexible circuit board at a contact point; and
   at least one structured intermediate isolation layer, having at least one opening effective to allow said semiconductor element to electrically contact said flexible circuit board at said contact point, wherein said isolation layer is between said substrate and said flexible circuit board.

2. A semiconductor power module according to claim 1, wherein said semiconductor element is at least one of a diode, a bipolar transistor, a MOSFET or an IGBT.

3. A semiconductor power module according to claim 2, wherein said semiconductor element is coated on each of said first face and said second face with a unilaterally structured coating for one of pressure contact or solder contact.

4. A semiconductor power module according to claim 2, wherein said second face of said semiconductor component is in electrical contact with said flexible circuit board through soldering.

5. A semiconductor power module according to claim 2, wherein said second face of said semiconductor component is in electrical contact with said flexible circuit board through pressure contact.

6. A semiconductor power module according to claim 1, wherein said flexible circuit board includes at least one structured conducting strip, said conducting strip being coated on all sides with insulating lamination having openings for electrical contact points of said conducting strip.

7. A semiconductor power module according to claim 1, wherein said structured intermediate isolation layer comprises a laminate of a glass fabric and epoxy resin, said laminate being coated on all sides with a layer of epoxy resin.

8. A semiconductor power module according to claim 1, wherein said structured intermediate isolation layer is of a thickness such that it is coplanar with said second face of said semiconductor element when said structured intermediate isolation layer is in place between said substrate and said flexible circuit board.

9. A semiconductor power module according to claim 1, wherein said flexible circuit board includes a cover film effective to, along with said substrate, provide mechanical and electrical isolation of said semiconductor power module.

10. A semiconductor power module according to claim 1, wherein said structured intermediate isolation layer, in conjunction with said flexible circuit board, is effective to hermetically seal said semiconductor power module.

* * * * *